(12) United States Patent
Kobayashi

(10) Patent No.: US 7,763,914 B2
(45) Date of Patent: Jul. 27, 2010

(54) SEMICONDUCTOR DEVICE FOR HIGH FREQUENCY

(75) Inventor: Masaki Kobayashi, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 76 days.

(21) Appl. No.: 12/174,660

(22) Filed: Jul. 17, 2008

(65) Prior Publication Data
US 2008/0277697 A1 Nov. 13, 2008

Related U.S. Application Data

(63) Continuation of application No. PCT/JP2007/000757, filed on Jul. 12, 2007.

(30) Foreign Application Priority Data

Jul. 12, 2006 (JP) .............................. 2006-191927

(51) Int. Cl.
*H01L 29/812* (2006.01)
(52) U.S. Cl. .............................. 257/276; 257/E29.319
(58) Field of Classification Search ......... 257/276–277, 257/410, E29.319
See application file for complete search history.

(56) References Cited

U.S. PATENT DOCUMENTS

| 5,185,534 A | | 2/1993 | Sakamoto et al. | |
|---|---|---|---|---|
| 5,283,452 A | * | 2/1994 | Shih et al. | 257/277 |
| 5,352,994 A | * | 10/1994 | Black et al. | 333/33 |
| 5,821,154 A | | 10/1998 | Nashimoto et al. | |
| 6,201,283 B1 | * | 3/2001 | Lai et al. | 257/410 |
| 6,392,278 B1 | | 5/2002 | Kimura | |
| 6,424,006 B1 | | 7/2002 | Ponse | |
| 6,465,297 B1 | * | 10/2002 | Henry et al. | 438/238 |
| 6,492,694 B2 | | 12/2002 | Noble et al. | |
| 2002/0033443 A1 | * | 3/2002 | Tran et al. | 250/214.1 |
| 2002/0137236 A1 | * | 9/2002 | Schaff et al. | 438/12 |
| 2009/0091011 A1 | * | 4/2009 | Das et al. | 257/675 |

FOREIGN PATENT DOCUMENTS

| DE | 195 22 364 C1 | 6/1995 |
|---|---|---|
| JP | 04-171734 A | 6/1992 |
| JP | 7-288299 A | 10/1995 |
| JP | 09-8064 A | 1/1997 |
| JP | 09-260401 A | 10/1997 |
| JP | 10-92847 A | 4/1998 |
| JP | 2000-174130 A | 6/2000 |
| JP | 2001-015526 A | 1/2001 |

* cited by examiner

*Primary Examiner*—Nathan W Ha
(74) *Attorney, Agent, or Firm*—Oblon, Spivak, McClelland, Maier & Neustadt, L.L.P.

(57) ABSTRACT

A semiconductor device for high frequency includes a channel region fabricated on a compound semiconductor substrate, a gate electrode fabricated on the channel region, a source electrode and a drain electrode alternately fabricated on the channel region by sandwiching the gate electrode, a bonding pad to be connected to an external circuit, and an air-bridge having one end connected to the source electrode or the drain electrode above and outside the channel region, and the other end connected to the bonding pad.

8 Claims, 3 Drawing Sheets

SEMICONDUCTOR DEVICE FOR HIGH FREQUENCY

CROSS-REFERENCE TO RELATED APPLICATION

This application is based upon and claims the benefit of priority from International Application No. PCT/JP2007/000757, filed on Jul. 12, 2007, which is based upon and claims the benefit of priority from the prior Japanese Patent Application No. 2006-191927, filed on Jul. 12, 2006, the entire contents of which are incorporated herein by reference.

TECHNICAL FIELD

The present invention relates to a semiconductor device for high frequency such as a field effect transistor used for high frequency.

DESCRIPTION OF THE RELATED ART

In recent years, with remarkable progress of inverter circuits and switching devices in performance, further improvement in high frequency characteristics and reliability is required for a field effect transistor, hereinafter referred to as FET.

Therefore, for instance, a multi-finger FET has been used. The multi-finger FET is configured so that a plurality of gate alleys are fabricated across a channel region. The plurality of gate alleys are connected with a gate circuit line fabricated in parallel to the channel region. A source electrode and a drain electrode are alternately fabricated by sandwiching the gate electrode and are connected to bonding pads through source/drain circuit lines respectively. At this time, the gate circuit line intersects with the source/drain circuit lines, however to ensure insulation of the circuit lines, a passivation film of SiN or the like is fabricated on the gate circuit line.

But, by thus forming the circuit lines directly on the passivation film of SiN or the like having high dielectric constant, stray capacitance is generated. Particularly, in a high-frequency region, the stray capacitance is not negligible. Accordingly, to reduce the stray capacitance, there has been used an air-bridge structure, in which an upper layer circuit line is fabricated over an air gap (see patent documents 1 and 2).

The source/drain electrodes in such an air-bridge structure are fabricated by sequentially piling ohmic contact of, for example, Pt/AuGe and metal layer of, for example, Au/Pt/Ti on an channel region. On the whole surface of the metal layer, a region where source/drain bonding pads are fabricated and a connecting region between source/drain bonding pads and the source/drain electrodes, for example, a single plated layer of Au is fabricated to form an air-bridge.

Au forming an air-bridge has a higher thermal expansion coefficient than a compound semiconductor substrate such as a GaAs substrate. Accordingly, temperature changes from a plating temperature (e.g. 60° C.) to an energizing temperature (e.g. 225° C. which is the burn-in temperature) or a non-energizing temperature (e.g. 25° C. which is the room temperature) and hence thermal expansion or thermal contraction occurs at the air-bridge. Such thermal expansion or thermal contraction generates a large internal stress such as compressive stress or tensile stress in the channel region. The internal stress causes problems of degradation of output power or low reliability.

[Patent Document 1]

Japanese Patent Application laid-Open No. 9-8064 (e.g. FIG. 1)

[Patent Document 2]

Japanese Patent Application laid-Open No. 2001-15526 (e.g. [0004], FIG. 1)

SUMMARY OF THE INVENTION

According to one aspect of the present invention, there is provided a semiconductor device for high frequency including an channel region fabricated on a compound semiconductor substrate; a gate electrode fabricated on the channel region, a source electrode and a drain electrode alternately fabricated on the channel region by sandwiching the gate electrode; a bonding pad to be connected to an external circuit; and an air-bridge having one end connected to the source electrode or the drain electrode above and outside the channel region, and the other end connected to the bonding pad.

DETAILED DESCRIPTION OF THE EMBODIMENTS

Referring now to the accompanying drawings, one embodiment of the present invention will be described below.

Figure 1:
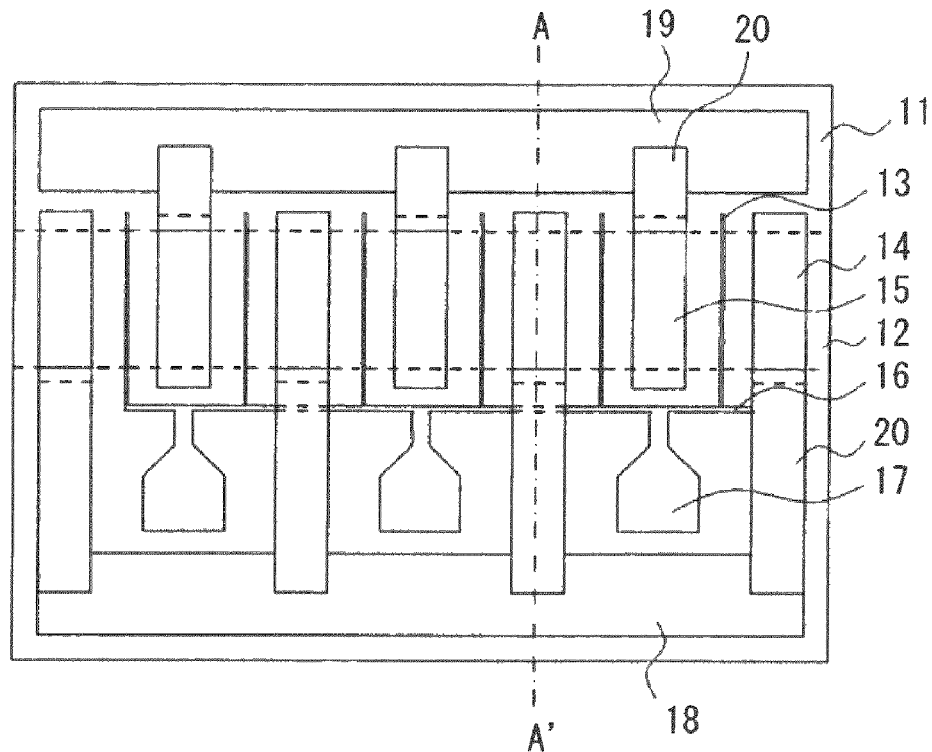
FIG. 1 is a top view illustrating a multi-finger FET device serving as a semiconductor device for high frequency according to one embodiment of the present invention.
Figure 2:
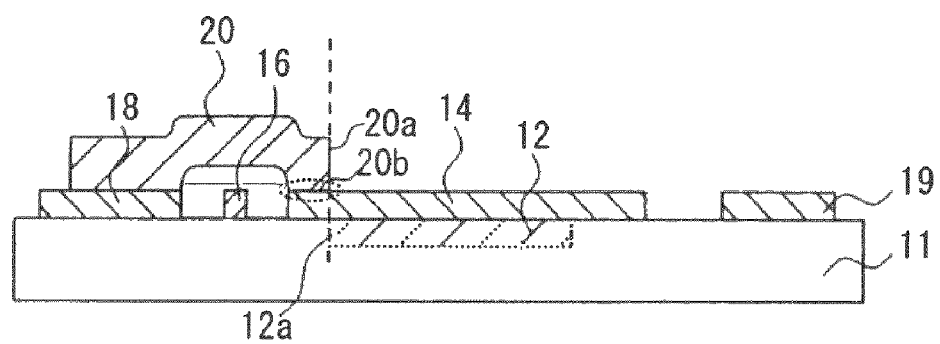
FIG. 2 is a sectional view taken along line A-A' of FIG. 1.

FIG. 1 is a top view illustrating a multi-finger FET device serving as a semiconductor device for high frequency according to the embodiment of the present invention, and FIG. 2 is a sectional view taken along line A-A' of FIG. 1. As illustrated, a channel region 12 is fabricated on a compound semiconductor substrate 11 and, on the channel region 12, a plurality of gate electrodes 13 are fabricated. A plurality of source electrodes 14 and drain electrodes 15 are alternately fabricated by sandwiching the gate electrodes 13 on a region including the channel region 12. The source electrodes 14 and the drain electrodes 15 are constructed by sequentially layering ohmic contacts of, for example, Pt/AuGe and a metal layer of, for example, Au/Pt/Ti. The gate electrodes 13 are connected with a gate bonding pad 17 through a gate circuit line 16, the gate bonding pad 17 is for bonding to the outside to input.

A source bonding pad 18 is fabricated on an opposite side of the channel region across from the gate bonding pads 17 and, a drain bonding pad 19 is fabricated on the opposite side of the gate bonding pads 17 and the source bonding pad 18 across the channel region. Further, an air-bridge 20 for connecting the source electrode 14 and the source bonding pad 18, or the drain electrode 15 and the drain bonding pad 19, are fabricated without any contact with a gate circuit line 16 or a passivation film (not illustrated) of SiN layer or the like. The air-bridge 20 is fabricated of, for example, a single metal plated layer of Au. An edge 20a of the air-bridge 20 is provided in proximity to an end 12a of the channel region 12. A contact region 20b to the source electrode 14 and/or the drain electrode 15 is disposed above and outside the channel region 12 in the air-bridge 20.

This type of structure can restrain generation of large internal stress such as compressive stress or tensile stress in the channel region 12 even when a temperature change generates thermal expansion or thermal contraction in the air-bridge 20 due to a difference in a thermal expansion coefficient from that of the substrate. This type of layout can restrain degradation of output power and can attain high reliability.

Figure 3:
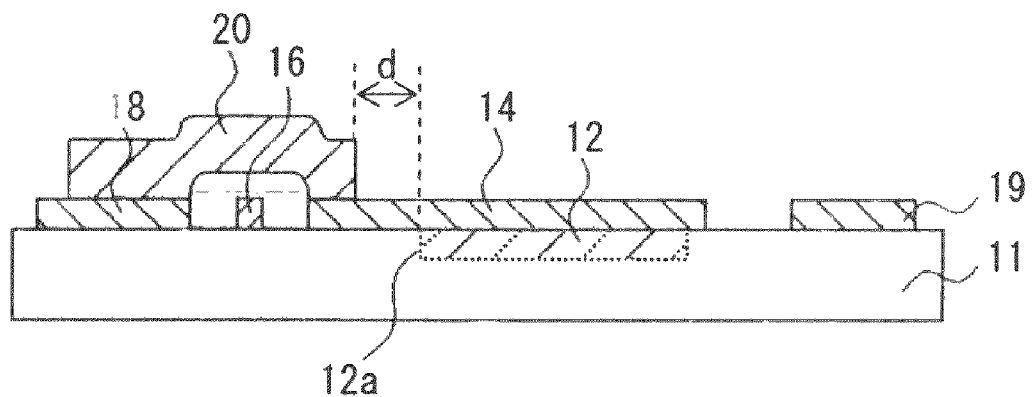
FIG. 3 is a sectional view illustrating a multi-finger FET device serving as a semiconductor device for high frequency according to one embodiment of the present invention.

In the present embodiment, the edge 20a of the air-bridge 20 is fabricated in proximity to the above of the end 12a of the channel region 12, but is not necessarily fabricated just above it. As illustrated in the sectional view of FIG. 3, separation of a distance d is allowed. It is because the air-bridge 20 and the channel region 12 are not to touch each other and alignment allowance is concerned. The alignment allowance is approximately $d \leq 0.2$ μm. Alignment allowance avoids overlapping between the air-bridge 20 and the channel region 12 caused by miss alignment. It is desirable that the air-bridge 20 and the channel region 12 should be as near as possible because miss alignment allowance increases the chip size.

Figure 4:
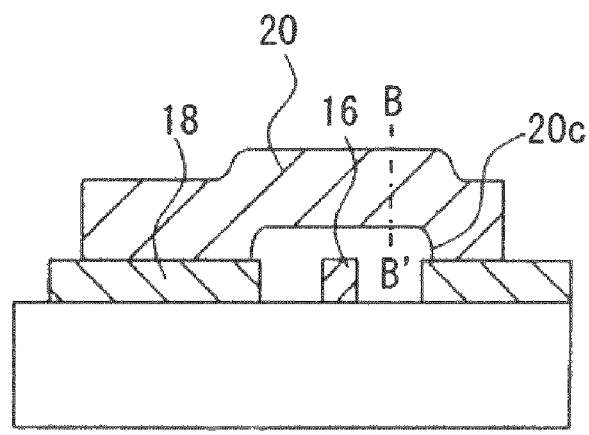
FIG. 4 is a sectional view illustrating a multi-finger FET device serving as a semiconductor device for high frequency according to one embodiment of the present invention.

As illustrated in the partially sectional view of FIG. 4, the end of the source electrode 14 (drain electrode 15) and the end 20c of the bottom face of the air-bridge 20 are not necessarily fabricated on the same plane. It is desirable that the area of cross sectional region of the air-bridge 20 is in contact with the source electrodes 14 is larger than the area of cross sectional region of the air-bridge 20 (at the line B-B'). So is the area of contact region where the air-bridge 20 is in contact with the drain electrodes 15. It will lessened connection resistance and magnetic field concentration.

Figure 5:
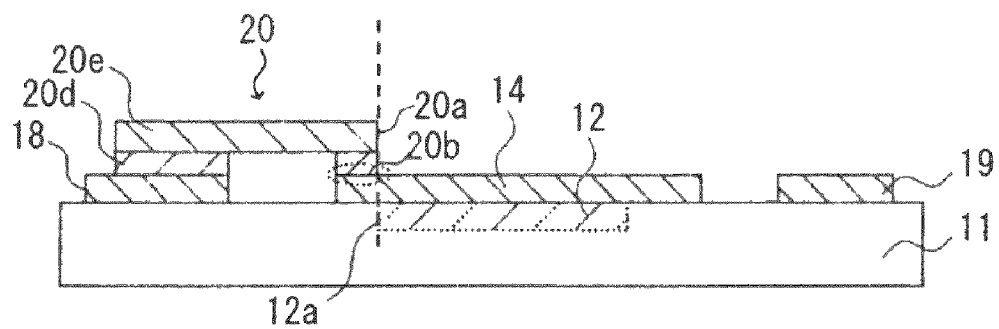
FIG. 5 is a partially sectional view illustrating a multi-finger FET device serving as a semiconductor device for high frequency according to one embodiment of the present invention.

It is desirable that the air-bridges are plated in Au metal in single layer. But as illustrated in the sectional view of FIG. 5, the contact region where the air-bridge 20 is in contact with the source electrodes 14 can be fabricated in the first layer 20d which serves as spacer and the second layer 20e which lift up the air-bridge. So is the contact region where the air-bridge 20 is in contact with the drain electrodes 15, or the source bonding pads 18, or the drain bonding pads 19.

In addition, the whole of the source bonding pad 18 and the drain bonding pad 19 may be fabricated integrally with the air-bridge.

Figure 6:
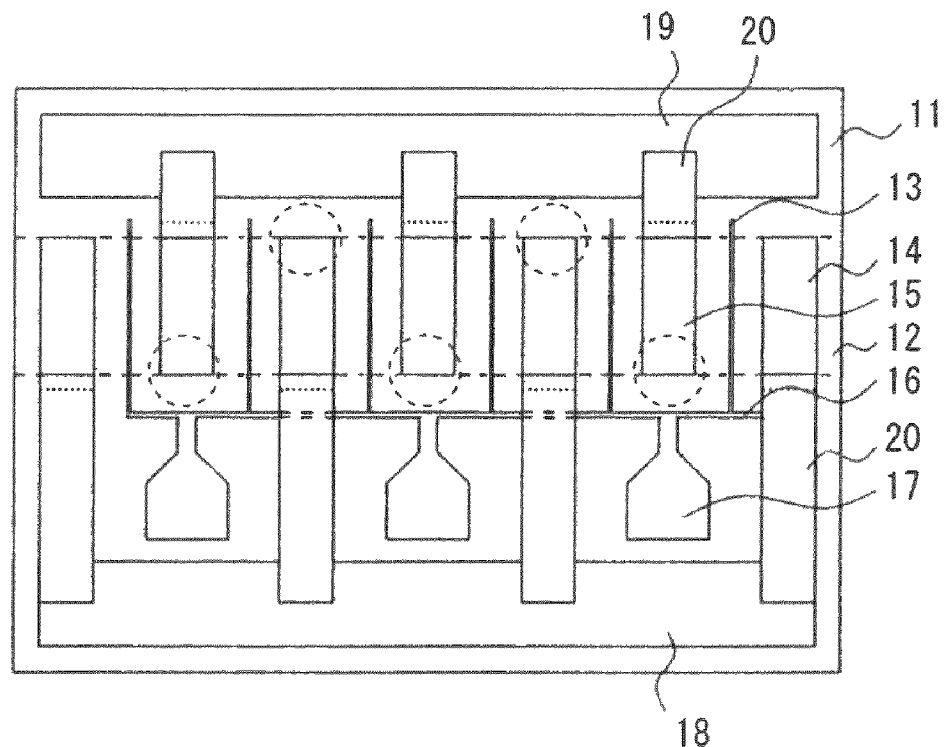
FIG. 6 is a top view illustrating a multi-finger FET device serving as a semiconductor device for high frequency according to one embodiment of the present invention.

Moreover, in the present embodiment, the source electrode 14 and the drain electrode 15 are fabricated so as to respectively protrude out of a region above the channel region 12, but it is not necessary that both ends protrude. As illustrated in the top view of FIG. 6, it is sufficient that the source electrodes 14 and the drain electrodes 15 respectively protrude, at least, to the side of source bonding pad 18 and the drain bonding pad 19 which are respectively connected to the source electrodes and the drain electrodes in order to provide a contact region outside the channel region.

A compound semiconductor substrate of GaAs is adopted, but a compound semiconductor substrate is not limited thereto and, a compound semiconductor substrate made of another material such as GaN or SiC can be used. Epitaxial wafer can be also adopted. Further, a heavily doped layer can be fabricated as a lower layer of the ohmic contact of each electrode by ion-implantation or formation of a heavily doped epitaxial layer.

These structures can be applied to FETs such as MESFET (Metal Semiconductor Field Effect Transistor) and MOSFET (Metal Oxide Semiconductor Field Effect Transistor) in addition to HEMT (High Electron Mobility Transistor).

The present invention is not limited to the foregoing embodiment and various changes and modifications may be made without departing from the spirit and scope of the present invention.

The invention claimed is:

1. A semiconductor device for high frequency comprising:
   a channel region fabricated on a compound semiconductor substrate;
   a gate electrode fabricated on the channel region;
   a source electrode, a part of which is fabricated on the channel region, and the source electrode disposed on a first side of the gate electrode;
   a drain electrode, a part of which is fabricated on the channel region, and the drain electrode disposed on a second side of the gate electrode opposite the first side;
   a bonding pad to be connected to an external circuit; and
   an air-bridge having one end connected to a contact region disposed on another part of the source electrode not fabricated on the channel region or on another part of the drain electrode not fabricated on the channel region, and the air-bridge having its other end connected to the bonding pad.

2. The semiconductor device for high frequency according to claim 1, wherein the air-bridge has an Au layer.

3. The semiconductor device for high frequency according to claim 2, wherein the Au layer is a single plated layer.

4. The semiconductor device for high frequency according to claim 1, wherein an edge of a contact region of the air-bridge with the source electrode or the drain electrode is in proximity to above of an edge of the channel region on the air-bridge side.

5. The semiconductor device for high frequency according to claim 1, wherein the edge of a contact region of the air-bridge with the source electrode or the drain electrode is distant from above of the end of the channel region on the air-bridge side.

6. The semiconductor device for high frequency according to claim 5, wherein a distance d between the edge of a contact region of the air-bridge with the source electrode or the drain electrode and the end of the channel region of the air-bridge side, d, satisfies $d \leq 0.2$ μm.

7. The semiconductor device for high frequency according to claim 1, wherein a connection area between the air-bridge and the source electrode or the drain electrode is larger than an area of a cross section of the air-bridge in a width direction.

8. The semiconductor device for high frequency according to claim 1, wherein the compound semiconductor substrate is a GaAs substrate.

* * * * *